(12) United States Patent
Haacke (10) Patent No.: US 7,573,265 B2
(45) Date of Patent: Aug. 11, 2009

(54) COMPLEX THRESHOLD METHOD FOR REDUCING NOISE IN NUCLEAR MAGNETIC RESONANCE IMAGES

(75) Inventor: E. Mark Haacke, Grosse Point Farms, MI (US)

(73) Assignee: Magnetic Resonance Innovations, Inc., Detroit, MI (US)

( * ) Notice: Subject to any disclaimer, the term of this patent is extended or adjusted under 35 U.S.C. 154(b) by 35 days.

(21) Appl. No.: 11/877,361

(22) Filed: Oct. 23, 2007

(65) Prior Publication Data
US 2009/0102481 A1  Apr. 23, 2009

(51) Int. Cl.
*G01V 3/00* (2006.01)
(52) U.S. Cl. .................................. 324/306; 324/307
(58) Field of Classification Search .............. 324/306, 324/307, 309
See application file for complete search history.

(56) References Cited

U.S. PATENT DOCUMENTS 6,192,264 B1 * 2/2001 Foo et al. .................... 600/413
6,658,280 B1 * 12/2003 Haacke ....................... 600/410

OTHER PUBLICATIONS

Edelstein et al.; "The intrinsic signal-to-noise ratio in NMR imaging"; Magn Reson Med; 1986; pp. 604-618; vol. 3.
Henkelman, R. M.; "Measurement of signal intensities in the presence of noise in MR images"; Medical Physics; 1985; pp. 232-233; vol. 12.
Rice, S.; "Mathematical analysis of random noise"; Bell System Tech J; 1944; pp. 282-333; vol. 23.
Bernstein et al.; "Improved detectability in low signal-to-noise ratio magnetic resonance images by means of a phase corrected real reconstruction"; Med Phys; 1989; pp. 813-817; vol. 16.
Gudbjartsson et al.; "The Rician distribution of noisy MRI data"; Magn Reson Med; 1995; pp. 910-914; vol. 34.
Andersen, A. H.; "On the Rician distribution of noisy MRI data"; Magn Reson Med Letter to the Editor; 1996; pp. 331-333; vol. 36.
Sijbers et al.; "Estimation of noise in magnitude MR images"; Magnetic Resonance Imaging; 1998; pp. 87-90; vol. 16.
Sijbers et al.; "Automatic estimation of the noise variance from the histogram of a magnetic resonance image"; Phys Med Biol; 2007; pp. 1335-1348; vol. 52.
Chang et al.; "An automatic method for estimating noise-induced signal variance in magnitude-reconstructed magnetic resonance images"; SPIE Med Imag 2005 Image Processing; 2005; pp. 1136-1142; vol. 5747.
Constable, R. T.; "Contrast, resolution and detectability in MR imaging"; Journal of Computer Assisted Tomography; 1991; pp. 297-303; vol. 15.
Hendrick et al.; "Basic physics of MR contrast agents and maximization of image contrast"; JMRI; 1993; pp. 137-148; vol. 3.

(Continued)

*Primary Examiner*—Louis M Arana
(74) *Attorney, Agent, or Firm*—Thompson Coburn LLP; Clyde L. Smith, Esq.

(57) ABSTRACT

A method of removing noise while preserving signal in nuclear magnetic resonance images combines steps of performing a magnitude threshold filter and performing a phase threshold filter on the image data. Preferably, a magnitude and phase connectivity algorithm is applied to pixels that fail to meet either the magnitude or phase thresholds.

18 Claims, 9 Drawing Sheets

OTHER PUBLICATIONS

Madore et al.; "A new way of averaging with applications to MRI"; Med Phys; 1996; pp. 109-113; vol. 23.

Mocovski, A.; "Noise in MRI"; Magnetic Resonance Imaging; 1996; pp. 494-497; vol. 38.

Nowak, R. D.; "Wavelet based rician noise removal for magnetic resonance imaging"; IEEE Trans Imag Proc; 1999; pp. 1408-1419; vol. 8.

Sijbers et al.; "Adaptive anisotropic noise filtering for magnitude MRI data"; Magnetic Resonance Imaging; 1999; pp. 1533-1539; vol. 17.

Lysaker et al.; "Noise removal using fourth-order partial differential equation with applications to medical magnetic resonance images in space and time"; 2003; pp. 1579-1590; vol. 12.

Chen et al.; "Noise removal in magnetic resonance diffusion tensor imaging"; Magn Reson Med; 2005; pp. 393-401; vol. 54.

Cline et al.; "Volume rendering and connectivity algorithms for MR angiography"; Magn Reson Med; 1991; pp. 384-394; vol. 18.

Lin et al.; "Automated local maximum-intensity projection with three-dimensional vessel tracking"; JMRI; 1992; pp. 519-526; vol. 2.

Reichenbach et al.; "Small vessels in the human brain: MR venography with deoxyhemoglobin as an intrinsic contrast agent"; Radiology; 1997; pp. 272-277; vol. 204.

Haacke et al.; "Susceptibility weighted imaging (SWI)"; Magn Reson Med; 2004; pp. 612-618; vol. 52.

\* cited by examiner

COMPLEX THRESHOLD METHOD FOR REDUCING NOISE IN NUCLEAR MAGNETIC RESONANCE IMAGES

CROSS-REFERENCE TO RELATED APPLICATIONS

None.

STATEMENT REGARDING FEDERALLY SPONSORED RESEARCH OR DEVELOPMENT

Not Applicable.

APPENDIX

Not Applicable.

BACKGROUND OF THE INVENTION

1. Field of the Invention

This invention relates generally to nuclear magnetic resonance imaging and, more particularly, to a method of applying threshold filters to both the magnitude and phase images of a complex nuclear magnetic resonance image in an effort to differentiate noise from signal information.

2. Related Art

Image data acquired from nuclear magnetic resonance includes both desirable signal information and unwanted noise. Removing noise from the image data improves boundary detection, visualization of phase images, and quantification of information in general. A simple and relatively effective means of removing noise has been to use a threshold filter on the magnitude images. However, this approach has its limitations and often leads to incomplete noise removal and the loss of some signal information in the image.

SUMMARY OF THE INVENTION

The methods of the present invention provide means to improve noise removal and signal preservation in magnetic resonance images by combining steps of performing a magnitude threshold filter and performing a phase threshold filter on the image data. The preferred embodiment of the invention subsequently applies a connectivity constraint to the filtered data to add back what is likely signal information that was deleted via the threshold filters.

In a first aspect of the invention, a method of reducing noise in a nuclear magnetic resonance image comprises a step of using a nuclear magnetic resonance imaging device to obtain magnitude and phase values from a nuclear magnetic resonance scan for each of a plurality of pixels of a digital image. The method also includes steps of applying a magnitude threshold filter to the magnitude value of each of at least some of the plurality of pixels and applying a phase threshold filter to the phase value of each of at least some of the plurality of pixels. Still further, the method comprises modifying the digital image by altering at least one of the magnitude and phase values of each of at least some of the plurality of pixels. The modifying step is dependent on the steps of applying the phase threshold filter and applying the magnitude threshold filter.

In another aspect of the invention, a method of reducing noise in a nuclear magnetic resonance image comprises using a nuclear magnetic resonance imaging device to obtain magnitude and phase values from a nuclear magnetic resonance scan for each of a plurality of pixels of a digital image. This method further includes a step of modifying the digital image by decreasing the absolute value of at least one of the phase and magnitude values of at least one of the plurality of pixels based on an application of a magnitude threshold filter to the plurality of pixels and an application of a phase threshold filter to the plurality of pixels.

In yet another aspect of the invention, a method of reducing noise in a nuclear magnetic resonance image comprises using a nuclear magnetic resonance imaging device to obtain magnitude and phase values from a nuclear magnetic resonance scan for each of a plurality of pixels of a digital image. The method further comprises a step of applying a magnitude threshold filter to the magnitude value of each of the plurality of pixels in a manner segregating each of the plurality of pixels into mutually exclusive first and second groups. The magnitude value of each pixel in the first group is above a threshold magnitude. The magnitude value of each pixel in the second group is at most the threshold magnitude. The method also comprises a step of applying a phase threshold filter to the phase value of each of the plurality of pixels in a manner segregating each of the plurality of pixels into mutually exclusive third and fourth groups. The absolute value of the phase value of each pixel in the third group is above a threshold phase. The absolute value of the phase value of each pixel in the fourth group is at most the threshold phase. Furthermore, the method comprises a step of segregating each of the plurality of pixels into mutually exclusive fifth and sixth groups. Each pixel in the second group and each pixel in the fourth group is also in the fifth group. Still further, the method comprises a step of modifying the digital image by decreasing the absolute value of at least one of the phase and magnitude values of at least one of the plurality of pixels. The step of modifying the digital image is dependant on each of the steps of applying the magnitude threshold filter, applying the phase threshold filter, and segregating each of the plurality of pixels into the fifth and sixth groups.

Further features and advantages of the present invention, as well as the operation of various embodiments of the present invention, are described in detail below with reference to the accompanying drawings.

BRIEF DESCRIPTION OF THE DRAWINGS

FIG. 9 illustrates an image of a brain obtain via a susceptibility weighted imaging and shows (a) the resulting magnitude image after performing the complex threshold procedure of the preferred embodiment, (b) the original phase image with the black arrow indicating a region with very low signal removed by the magnitude threshold and which cannot be recaptured by phase connectivity because of the low SNR, the white arrow indicating a region of rapid phase change that leads to aliasing but which does not lead to removal from the image because phase continuity still persists, (c) the resulting phase image after performing the complex threshold procedure of the preferred embodiment, and (d) a replication of FIG. 9(c) showing that the overall phase image and boundaries are well maintained after the CTM filtering procedure.

DETAILED DESCRIPTION OF THE PREFERRED EMBODIMENT

In complex magnetic resonance (MR) images, the presence of noise in both the magnitude image and phase image adversely impacts image quality. An assumption can be made that the original real and imaginary channels of MR images generate noise that is Gaussian with mean zero and standard deviation $\sigma_0$. More particularly, magnitude images tend to follow a Rayleigh distribution in areas of only noise and, more generally, the Rician distribution where both signal and noise are present. In terms of the magnitude M, the probability density function is given by Eq. [1].

$$p_M(M) = \frac{M}{\sigma^2} e^{\frac{-(M^2+A^2)}{2\sigma^2}} I_0\left(\frac{A \cdot M}{\sigma^2}\right) \quad [1]$$

where $I_0$ is the modified zero-th order Bessel function of the first kind. For a low signal-to-noise ratio (SNR), i.e., $A/\sigma \leq 1$, the Rician distribution is far from being Gaussian. On the other hand, as shown in Eq. [2], the distribution approaches a Gaussian distribution when $A/\sigma > 3$:

$$p_M(M) = \frac{1}{\sqrt{2\pi\sigma^2}} e^{\frac{-\left(M-\sqrt{A^2+\sigma^2}\right)^2}{2\sigma^2}} \quad [2]$$

with variance $\sigma^2$ and mean $\sqrt{A^2+\sigma^2}$. In regions of noise only, A=0, and Eq. [1] collapses to the Rayleigh distribution:

$$p_M(M) = \frac{M}{\sigma^2} e^{\frac{-M}{2\sigma^2}} \quad [3]$$

For phase images, in regions where there is only noise, the distribution governing the noise is the uniform distribution:

$$p(\varphi) \begin{cases} \frac{1}{2\pi} & \text{if } -\pi < \varphi < \pi \\ 0 & \text{otherwise} \end{cases} \quad [4]$$

The standard deviation of the phase is:

$$\sigma_{phase} = \frac{1}{SNR_{mag}} \quad [5]$$

where the units for $\sigma_{phase}$ are in radians, and $SNR_{mag}$ is the signal-to-noise ratio in the voxel of the magnitude image. The noise distribution in regions of the image where there is an object present can be considered as a zero mean Gaussian distribution when $A \gg \pi$, that is:

$$p_{noise}(\varphi) = \left[2\pi\left(\frac{\sigma}{A}\right)^2\right]^{-\left(\frac{1}{2}\right)} e^{\frac{-(\varphi^2)}{2\left(\frac{\sigma}{A}\right)^2}} \quad [6]$$

Figure 1:
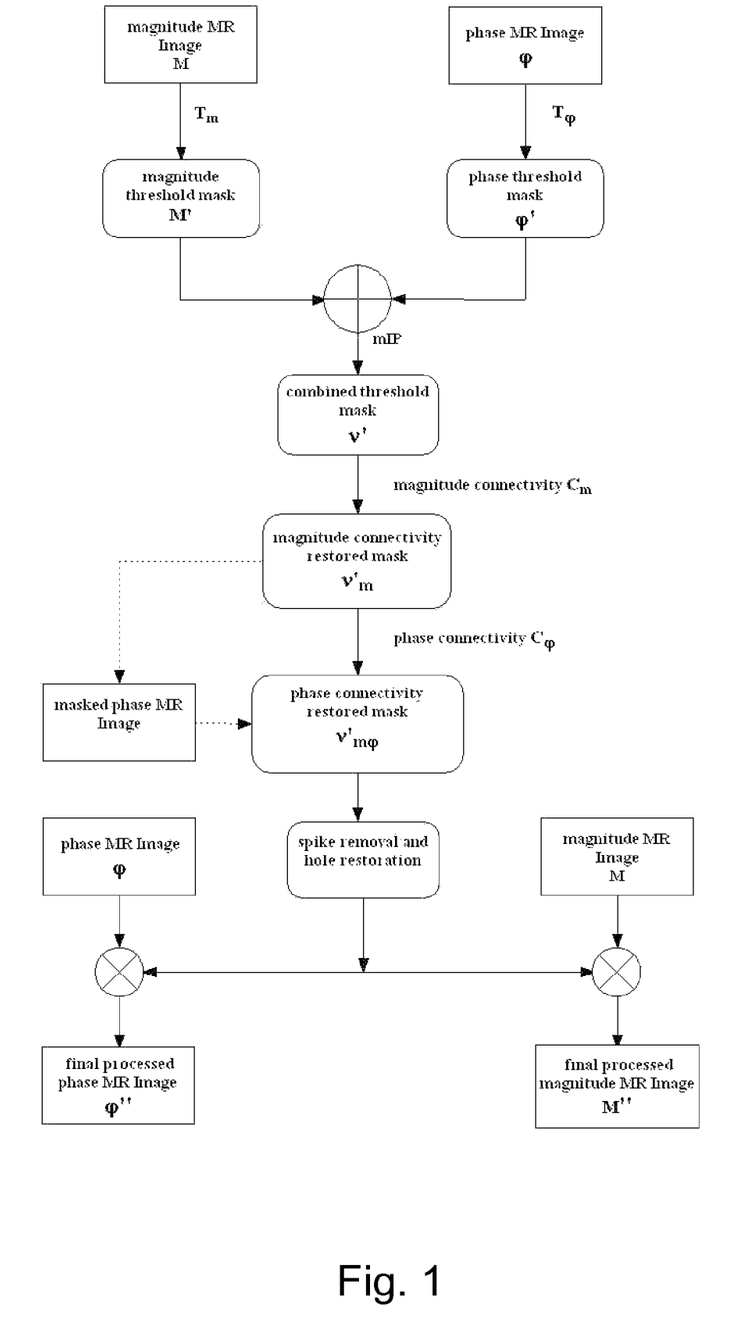
FIG. 1 illustrates a flow chart of the preferred embodiment of the invention.

The preferred embodiment of the present invention incorporates the relationship between the noise in both phase and magnitude images and provides a more powerful thresholding technique. For purposes of describing the invention, any method in accordance with the invention is herein referred to as a Complex Threshold Method (CTM). The preferred embodiment of a CTM consists of: first, the application of two thresholds to the MR images, namely $m\sigma_0$ for the magnitude image and $n\sigma_{phase}$ for the phase image, where m and n are real numbers; and second, the application of connectivity in order to minimize Type I and Type II errors. The processing algorithm is shown graphically in the flowchart of FIG. 1.

In performing the magnitude thresholding technique, a threshold is applied to the magnitude image and a binary noise removing mask image M' is created. This operation can be represented as:

$$T_m: M'(x, y) = \begin{cases} 0 & \text{if } M(x, y) \leq m\sigma_0 \\ 1 & \text{if } M(x, y) > m\sigma_0 \end{cases} \quad [7]$$

where M is the magnitude MR image, m is the magnitude threshold and $\sigma_0$ is the standard deviation of noise as estimated from the image.

The useful information in the phase images is exploited by using a phase threshold technique. This step is performed on the phase image φ by creating a binary noise removing mask φ' by admitting all phase values between $(n\sigma_{phase})$ and $(-n\sigma_{phase})$. Assuming (φ(x, y) is the phase image, then the mask φ' is determined from:

$$T_\varphi: \varphi(x, y) = \begin{cases} 0 & \text{if } \varphi(x, y) > (n\sigma_{phase}) \\ 0 & \text{if } \varphi(x, y) < (-n\sigma_{phase}) \\ 1 & \text{otherwise} \end{cases} \quad [8]$$

where $\sigma_{phase}$ is the standard deviation of noise in phase image estimated from the corresponding SNR in the magnitude image.

The preferred CTM combines the magnitude and phase thresholds to eliminate more noise than either method independently. This is accomplished by taking the minimum intensity projection v'(x, y) of the magnitude mask M'(x, y) and phase mask φ'(x, y) as follows:

$$v'(x, y) = \begin{cases} 0 & \text{if either } M'(x, y) = 0 \text{ or } \varphi(x, y) = 0 \\ 1 & \text{otherwise} \end{cases} \quad [9]$$

Figure 2:
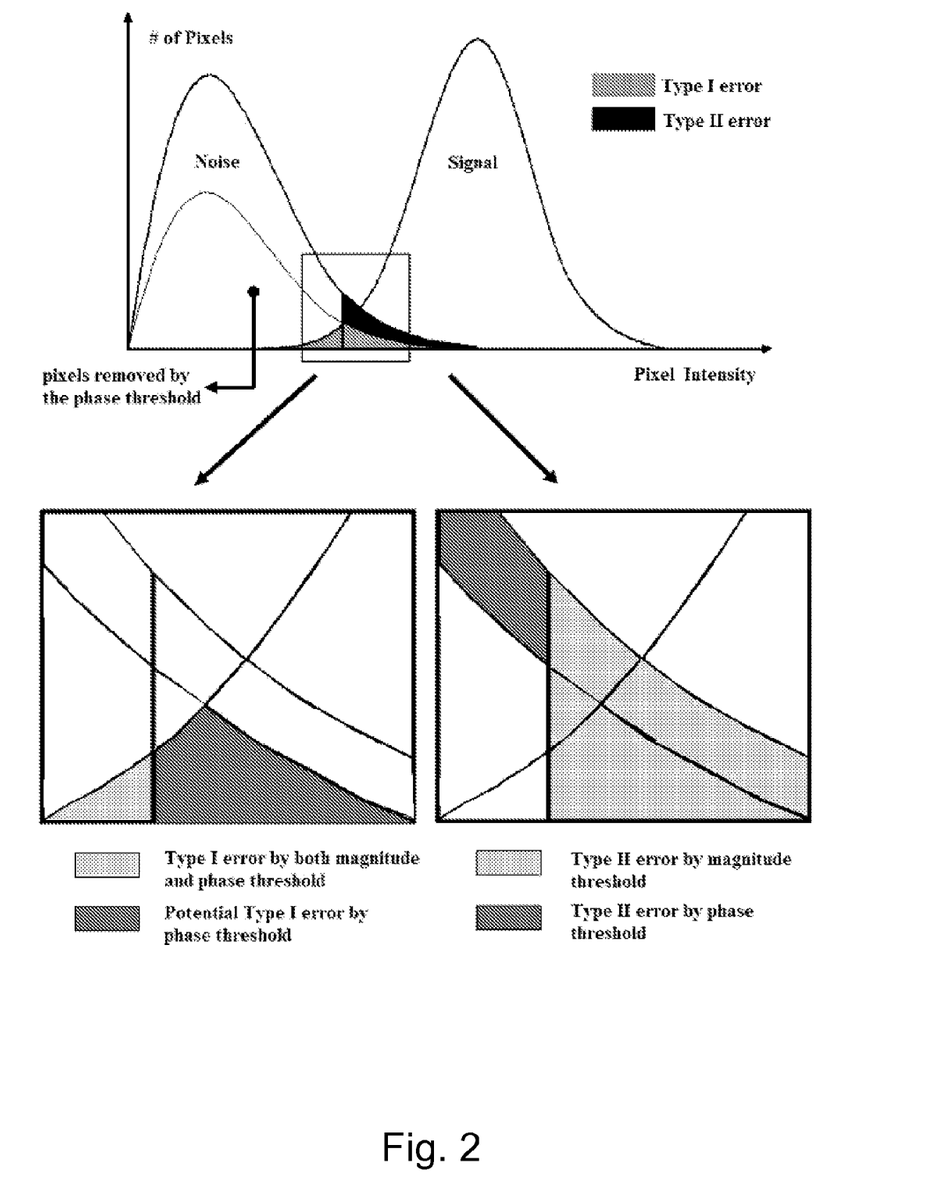
FIG. 2 illustrates a bimodal curve showing the Rayleigh distribution for the noise (left distribution) and Rician distribution for the signal (right distribution), with shaded areas indicating Type I and Type II error caused by the application of the phase threshold filter and the magnitude threshold filter of the preferred embodiment.

The process of choosing one or the other or both thresholds on the noise outside the object is shown statistically by examining the distribution of the magnitude data in conjunction with the uniform phase distribution as shown in FIG. 2. However, these thresholds still remove signal information from the object (thereby producing Type I error) and fail to remove some noise pixels (thereby producing Type II error). We define these errors as:

$$\text{Type I error} = \frac{\text{total number of signal pixels removed}}{\text{total number of signal pixels}} \quad [10]$$

$$\text{Type II error} = \frac{\text{total number of noise pixels left}}{\text{total number of noise pixels}} \quad [11]$$

Referring to FIG. 2, when only the phase threshold is applied, Type I error can come from the overlap between the signal and the noise probability distributions. When both thresholds are applied, only the points to the left of the magnitude threshold contribute to Type I error. Similarly, as for Type II error, a phase only threshold would allow points to the left of the magnitude threshold contribute to the noise being considered as part of the object. When both thresholds are applied, only the points to the right of the magnitude threshold are considered as part of the object.

To reduce Type I and Type II error, the CTM of the preferred embodiment utilizes a local connectivity algorithm. Pixel connectivity defines a relation between a pixel and its immediately adjacent surrounding neighborhood of pixels. For any pixel p having coordinates (x, y), its 8-neighborhood $N_8(p)$ is defined as all those pixels that are immediately adjacent to the pixel p(x, y) (at least for a two-dimensional image with square pixels). The connectivity is preferably applied to both the magnitude and phase images. Preferably, the connectivity step is applied to only the points that failed to meet either the phase threshold or the magnitude threshold. For each such point, connectivity is applied by determining whether or not the number of pixels that are connected to p in $N_8(p)$ of the magnitude image and that exceed that the magnitude threshold $m\sigma_0$ is greater than some integer number m. If so, then the data of p is not discarded as noise. Similarly, connectivity is applied by determining whether or not the number of pixels that are connected to p in $N_8(p)$ of the phase image and that exceed that the phase threshold $n\sigma_{phase}$ is greater than some integer number $\tau_p$. If so, then the data of p is not discarded as noise. We refer to these two connectivity operators as $C_m$ and $C_\phi$, respectively. The combined thresholded mask v'(x, y) is modified to $v'_m(x, y) = C_m(v'(x, y))$ and this in turn is modified according to $v'_{m\phi}(x,y) = C_\phi(v'_m(x,y))$. It should be appreciated that connectivity could also be applied to more or less of the all points of the MR image and could be used to remove the data of pixels presumed to be unintentionally remaining.

As a final step of the preferred CTM embodiment, a simple spike removal and hole restoration algorithm is applied. Since most of the noise is removed with the combined thresholding and connectivity steps, the remaining points that constitute Type II error are predominantly single pixels of noise and a few single pixels that are lost along the edges of the object. The spike removal and hole restoration algorithm works on these single pixels to remove/restore them. The algorithm is applied as follows: first, every pixel in the noise reduced image is examined for its neighborhood for connected pixels. Since the application of the magnitude connectivity has insisted on two or three or more pixels being connected, those that are not connected are considered to be noise and are therefore removed. The spike removal algorithm is run with a magnitude connectively of 4 in order to avoid the dilational effects of a connectivity of 3.

To further describe the preferred CTM embodiment and to demonstrate its benefits, simulations of its application are described below. Simulated images were created to test the algorithm under controlled conditions for a circle object of radius 128 pixels embedded in a square field-of-view of 512 pixels across. Using a Monte Carlo approach, the SNR in the circle was set to 3:1, 5:1, and 10:1 and the algorithm tested in each case. A receiver-operator characteristic (ROC) plot was produced for each SNR value for each of the steps of the preferred embodiment. These plots (FIGS. 3-6) show the effects of the different components of the algorithm on Type I and Type II errors. The algorithm was also applied to T1-weighted MRI data and susceptibility weighted imaging (SWI) data of a human brain to test the noise removal procedure both in magnitude and phase. The TI-weighted MRI data was acquired with an in-plane resolution of 512×448 (0.5×0.5 mm2), TR/TE=20/6 msec, flip angle (FA)=25o and a FOV=256 mm×224 mm. The SWI brain volume was acquired with an in-plane resolution of 512×512 (0.5×0.5 mm2), TR/TE=29/15 msec, flip angle (FA)=12o, and FOV=256 mm×256 mm.

Figure 3:
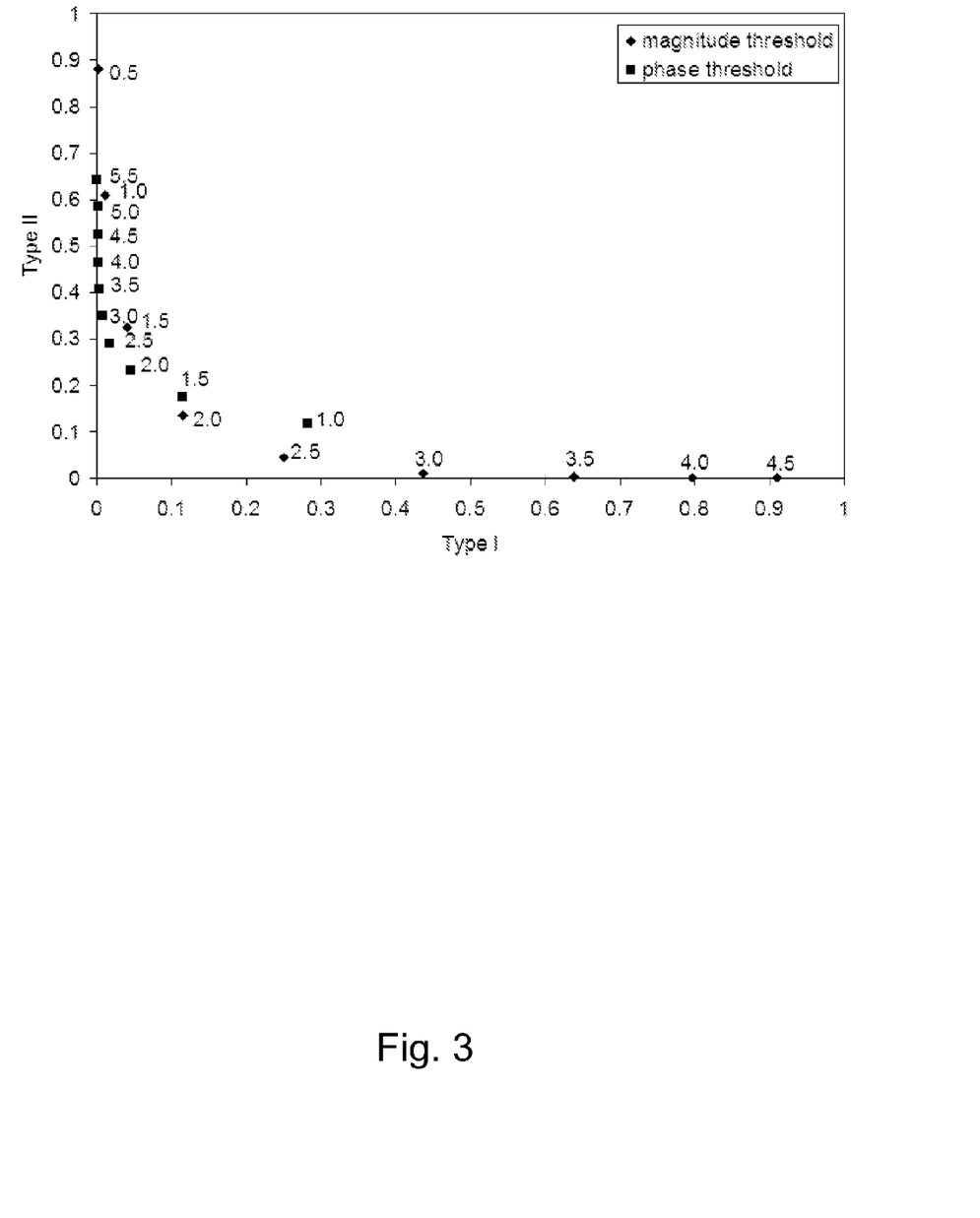
FIG. 3 illustrates Type I error versus Type II error for magnitude threshold values from 0.5 to 4.5 and phase threshold values from 1.0 to 5.5, with the lowest sum of errors being produced for m=2 and n=1.5 for image data having a signal-to-noise ratio (SNR) of 3:1.
Figure 4:
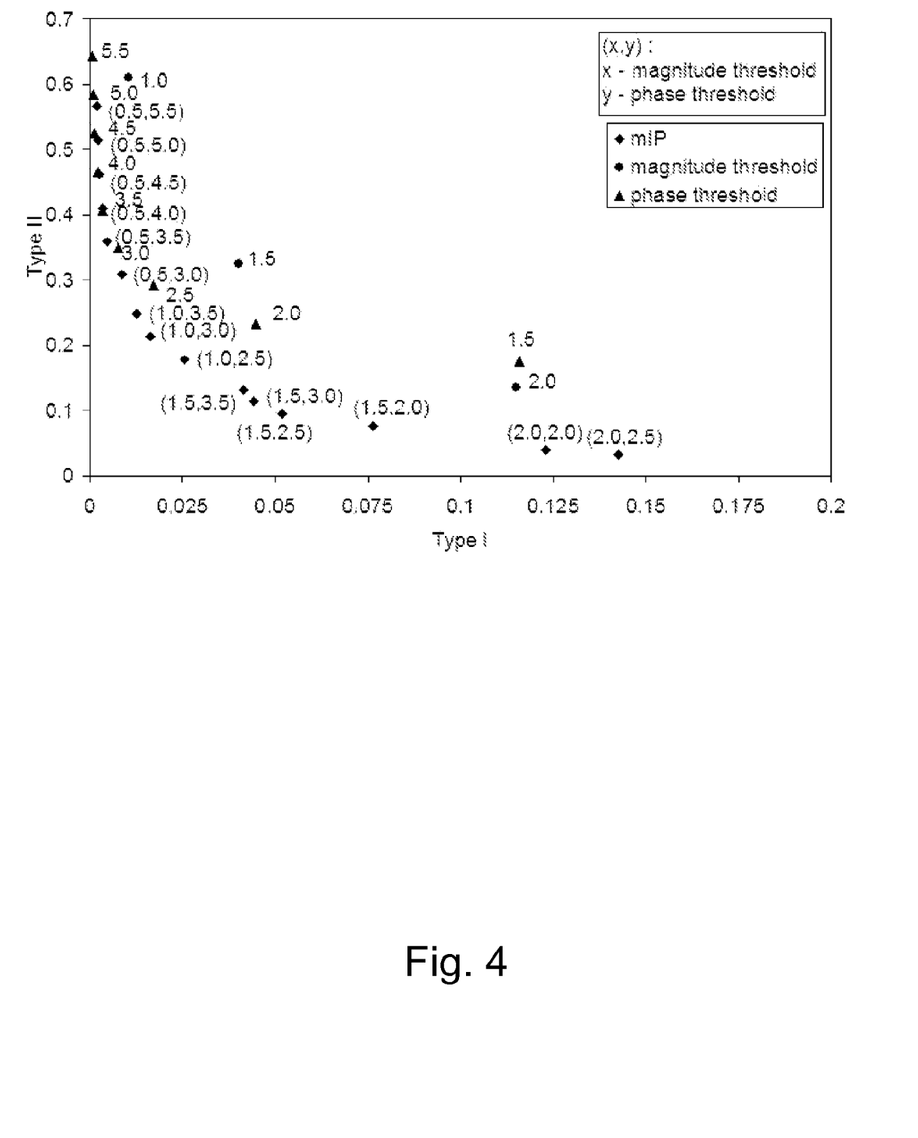
FIG. 4 illustrates the receiver operator characteristic curve (ROC) resulting from combining both magnitude (circles) and phase (triangles) threshold operations (SNR 3:1) indicating a reduction of Type I and Type II errors in the combined operation (diamonds).
Figure 5:
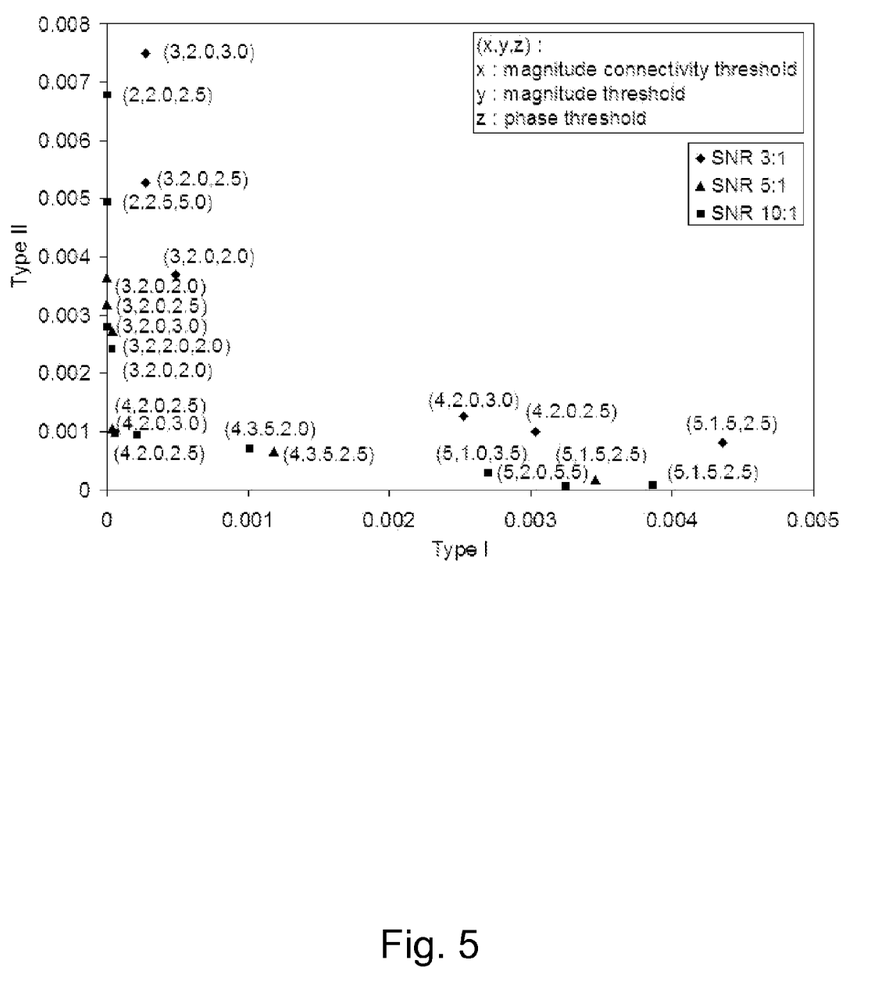
FIG. 5 illustrates magnitude connectivity effects on Type I and Type II error for images having SNRs of 3:1, 5:1 and 10:1.
Figure 6:
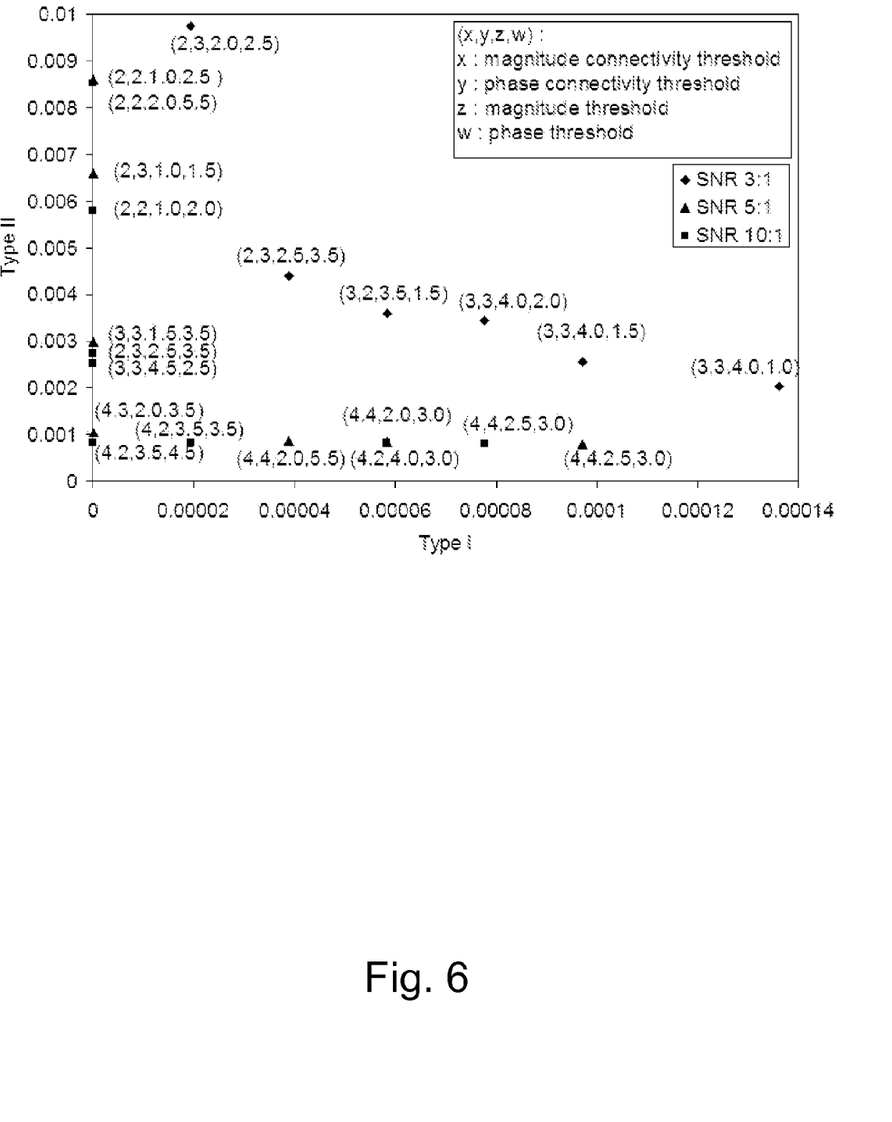
FIG. 6 illustrates phase connectivity effects on Type I and Type II error for images having SNRs of 3:1, 5:1 and 10:1.
Figure 7:
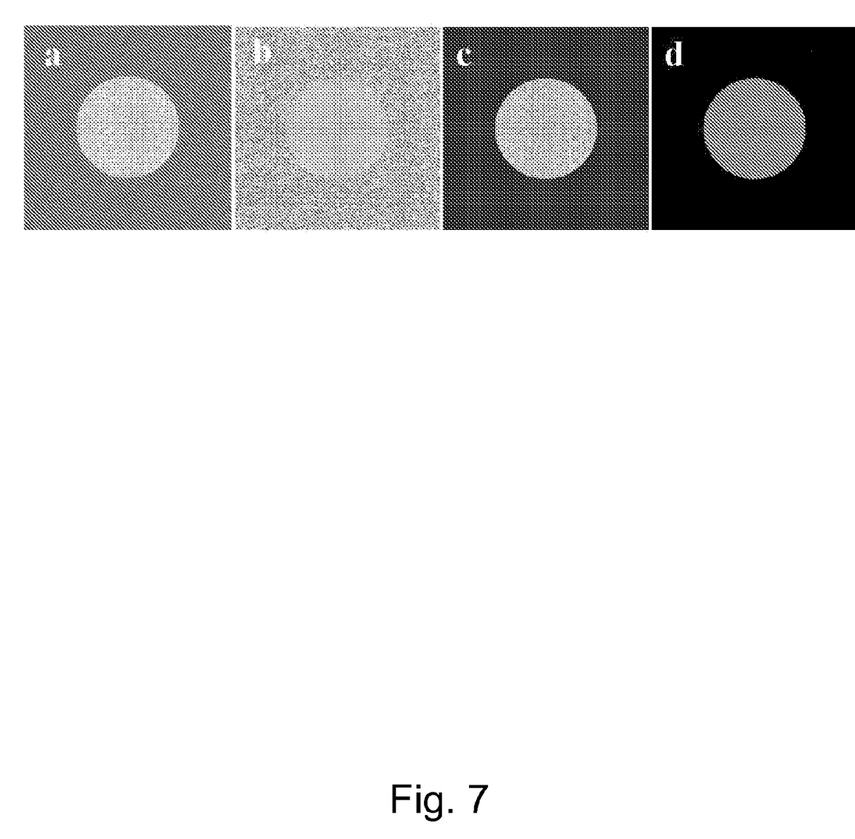
FIG. 7 illustrates application of the invention to simulated data having an SNR of 3:1 and shows (a) the magnitude image, (b) the corresponding phase image, (c) the processed magnitude image after applying magnitude and phase connectivity of three each, a magnitude threshold of m=2, and a phase threshold of n=2, and (d) the processed phase image showing no noise remaining outside the object.

The ROC curve for magnitude and phase thresholds (both separately and combined) for the circle simulation are shown in FIGS. 3 and 4, respectively, for an SNR of 3:1. FIG. 4, demonstrates that both errors remain rather large for either the magnitude or phase methods, but with some moderate improvement when both are combined. As shown in FIG. 5, adding magnitude connectivity dramatically reduced Type I error. Keeping Type I error small would suggest using magnitude and phase connectivities of 3 and 2 for an SNR of 3:1 and 4 and 3 for the higher SNR. With a focus on minimizing Type I error while still maintaining low Type II error, a connectivity number of three produced the best results for the circle data. A connectivity number of three keeps the Type I error at about 0.0005 (i.e., only one pixel in 2000 is incorrectly thrown out as noise). With the same connectivity number, only 1 noise point in 250 is kept in the image. As shown in FIG. 6, adding phase connectivity further reduced the errors. Sacrificing a little error in removing signal from the circle and using a connectivity number of three for the phase threshold keeps the Type II error at 1 noise point in 250 while it also reduces Type I error to less than one in 10,000. Although successful in reducing error in low SNR images, as shown in FIGS. 5 and 6, the Type I error is further decreased to values lower than 0.0001 when the SNRs of the images is initially 5:1 or 10:1. Running the spike removal and hole routine yields Type I and Type II errors of $1.944 \cdot 10^{-5}$ and 0.0035, respectively, and running it twice yields zero and 0.005, respectively. For the higher SNR cases, magnitude and phase connectivities of 4 provide the best results. An example of the full processing as applied to the simulated circle for an SNR of 3:1 is shown in FIG. 7. The final Type I error is 0.000486 (25 pixels) and Type II error is 0.002112 (445 pixels). Finally, the time to fully process one complex image is just under three seconds at a processing rate of 3.06 GHz.

Figure 8:
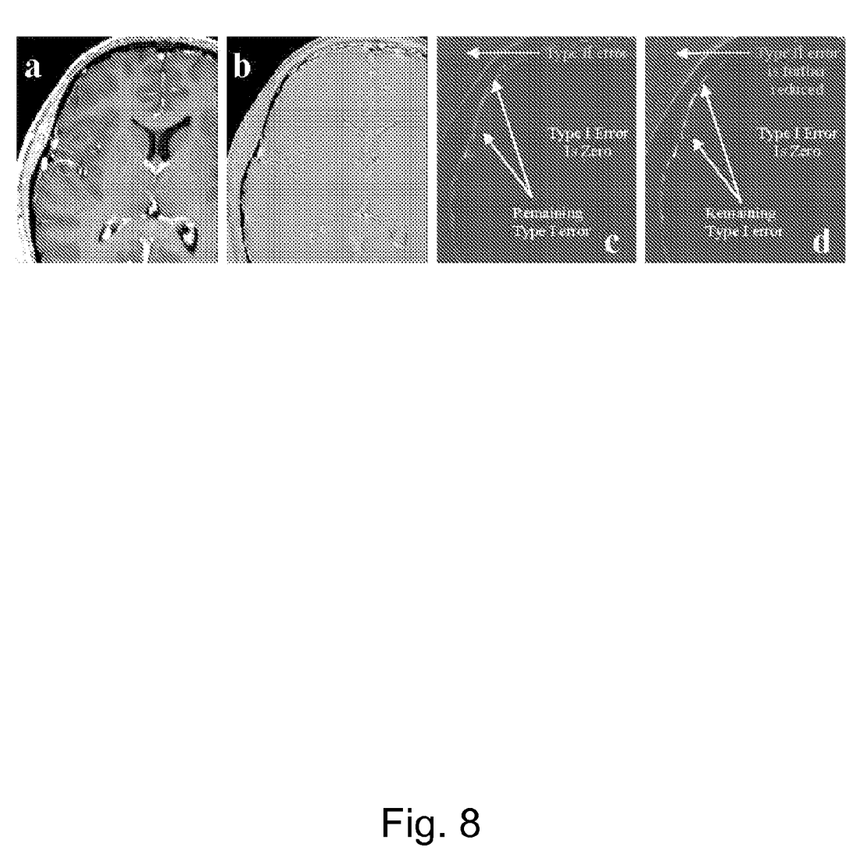
FIG. 8 illustrates application of the invention to an image generated from a nuclear magnetic resonance scan of a human brain having an SNR of 16:1 and shows (a) the final magnitude, (b) the final phase, (c) the subtraction of the original magnitude image minus the magnitude image obtained after maximum intensity projection and (d) the subtraction of the original magnitude image minus the image obtained after applying magnitude and phase connectivity.
Figure 9:
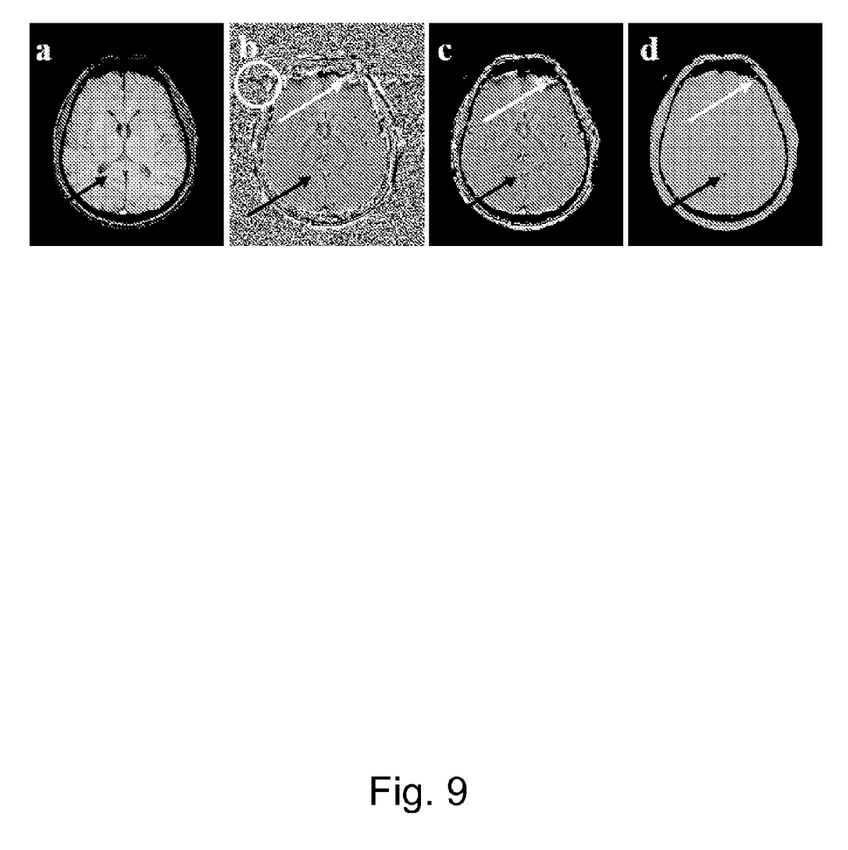

As for the human data, an estimate of background noise was determined by selecting a region of interest outside the brain and using the pixel intensity values to obtain the estimate of $\sigma_0$. The mean of the noise (signal) outside the object was approximated as being 1.25 standard deviations of that on the inside. An example of T1-weighted data is shown in FIG. 8. FIG. 8 shows that all the noise was removed outside the object and all the structures inside the imaged brain are kept except at the edges where there is fat present which caused major jumps in phase that disrupt the ability of the connectivity algorithm to recognize these points as part of the original object. The SNR was 16:1, the parameters used were: ($\tau_m$=3, $\tau_p$=3, m=4, n=2). The final processed images show that the Type I and Type II errors found inside the brain region and outside the brain region, respectively, were completely removed using the values (3, 3, 4, 2) for magnitude and phase connectivity and magnitude and phase thresholds. However, remnant Type I error persists along the edges of the brain. An example of susceptibility weighted imaging data using (3, 3, 4, 2) is shown in FIG. 9. Errors remain along the edges of the object, but the overall reduction of noise from the phase for display purposes is significant and advantageous.

In view of the foregoing, it will be seen that the several advantages of the invention are achieved and attained.

As various modifications could be made in the constructions and methods herein described and illustrated without departing from the scope of the invention, it is intended that all matter contained in the foregoing description or shown in the accompanying drawings shall be interpreted as illustrative rather than limiting. Thus, the breadth and scope of the present invention should not be limited by any of the above-described exemplary embodiments, but should be defined only in accordance with the following claims appended hereto and their equivalents.

Furthermore, it should be understood that when introducing elements of the present invention in the claims or in the above description of the preferred embodiment of the invention, the terms "comprising," "including," and "having" are intended to be open-ended and mean that there may be additional elements other than the listed elements. Additionally, the term "portion" should be construed as meaning some or all of the item or element that it qualifies. Moreover, use of identifiers such as first, second, and third should not be construed in a manner imposing any relative position or time sequence between limitations. Still further, the order in which the steps of any method claim that follows are presented should not be construed in a manner limiting the order in which such steps must be performed.

What is claimed is:

1. A method of reducing noise in a nuclear magnetic resonance image comprising:
   using a nuclear magnetic resonance imaging device to obtain magnitude and phase values from a nuclear magnetic resonance scan for each of a plurality of pixels of a digital image;
   applying a magnitude threshold filter to the magnitude value of each of at least some of the plurality of pixels;
   applying a phase threshold filter to the phase value of each of at least some of the plurality of pixels;
   modifying the digital image by altering at least one of the magnitude and phase values of each of at least some of the plurality of pixels, the modifying being dependent on the steps of applying the phase threshold filter and applying the magnitude threshold filter.

2. A method in accordance with claim 1 further comprising a step of applying a local connectivity algorithm to at least one of the magnitude and phase values of each of at least some of the plurality of pixels, and wherein the step of modifying the digital image is dependent on the step of applying the local connectivity algorithm.

3. A method in accordance with claim 1 wherein the step of applying the magnitude threshold filter to the magnitude value of each of the at least some of the pixels occurs in a manner such that the magnitude value of each of a first group of such pixels is at most a minimum magnitude threshold and the magnitude value of each of a second group of such pixels is greater than the minimum magnitude threshold, and wherein the step of modifying the digital image is dependent on how many pixels immediately adjacent a first one of the plurality of pixels are in one of the first and second groups.

4. A method in accordance with claim 1 wherein the step of applying the phase threshold filter to the phase value of each of the at least some of the pixels occurs in a manner such that the absolute value of the phase value of each of a first group of such pixels is at most a minimum phase threshold and the absolute value of the phase value of each of a second group of such pixels is greater than the minimum phase threshold, and wherein the step of modifying the digital image is dependent on how many pixels immediately adjacent a first one of the plurality of pixels are in one of the first and second groups.

5. A method in accordance with claim 4 wherein the step of applying the magnitude threshold filter to the magnitude value of each of the at least some of the pixels occurs in a manner such that the magnitude value of each of a third group of such pixels is at most a minimum magnitude threshold and the magnitude value of each of a fourth group of such pixels is greater than the minimum magnitude threshold, and wherein the step of modifying the digital image is dependent on how many pixels immediately adjacent a second one of the plurality of pixels are in one of the third and fourth groups.

6. A method in accordance with claim 5 wherein the step modifying the digital image is dependent on there being no more than two of the pixels of the second group immediately adjacent the first pixel and on there being no more than three of the pixels of the fourth group immediately adjacent the second pixel.

7. A method in accordance with claim 1 wherein the image is a gradient echo image that has not been modified by a high pass filter.

8. A method in accordance with claim 1 wherein the image is a gradient echo image that has been modified by a high pass filter.

9. A method in accordance with claim 1 wherein the image is a spin echo image that has not been modified by a high pass filter.

10. A method in accordance with claim 1 wherein the image is a spin echo image that has been modified by a high pass filter.

11. A method of reducing noise in a nuclear magnetic resonance image comprising:
    using a nuclear magnetic resonance imaging device to obtain magnitude and phase values from a nuclear magnetic resonance scan for each of a plurality of pixels of a digital image;
    modifying the digital image by decreasing the absolute value of at least one of the phase and magnitude values of at least one of the plurality of pixels based on an application of a magnitude threshold filter to the plurality of pixels and an application of a phase threshold filter to the plurality of pixels.

12. A method in accordance with claim 11 wherein the step of modifying the digital image comprises decreasing the absolute value of both the phase and magnitude values associated with the at least one of the plurality of pixels.

13. A method in accordance with claim 12 wherein the step of modifying the digital image comprises setting both the phase and magnitude values associated with the at least one of the plurality of pixels equal to zero.

14. A method in accordance with claim 11 further comprising a step of applying a local connectivity algorithm to at least one of the magnitude and phase values of each of at least some of the plurality of pixels, and wherein the step of modifying the digital image is dependent on the step of applying the local connectivity algorithm.

15. A method of reducing noise in a nuclear magnetic resonance image comprising:
   using a nuclear magnetic resonance imaging device to obtain magnitude and phase values from a nuclear magnetic resonance scan for each of a plurality of pixels of a digital image;
   applying a magnitude threshold filter to the magnitude value of each of the plurality of pixels in a manner segregating each of the plurality of pixels into mutually exclusive first and second groups, the magnitude value of each pixel in the first group being above a threshold magnitude, the magnitude value of each pixel in the second group being at most the threshold magnitude;
   applying a phase threshold filter to the phase value of each of the plurality of pixels in a manner segregating each of the plurality of pixels into mutually exclusive third and fourth groups, the absolute value of the phase value of each pixel in the third group being above a threshold phase, the absolute value of the phase value of each pixel in the fourth group being at most the threshold phase;
   segregating each of the plurality of pixels into mutually exclusive fifth and sixth groups, each pixel in the second group and each pixel in the fourth group is also in the fifth group;
   modifying the digital image by decreasing the absolute value of at least one of the phase and magnitude values of at least one of the plurality of pixels, the modifying being dependant on each of the steps of applying the magnitude threshold filter, applying the phase threshold filter, and segregating each of the plurality of pixels into the fifth and sixth groups.

16. A method in accordance with claim 15 further comprising applying a connectivity algorithm to the pixels in the fifth group without also applying the connectivity algorithm to the pixels in the sixth group, and wherein the step of modifying the digital image is dependant on the step of applying the connectivity algorithm.

17. A method in accordance with claim 16 wherein the step of applying the connectivity algorithm comprises applying phase connectivity and magnitude connectivity to at least some of the plurality of pixels.

18. A method in accordance with claim 17 further comprising a step of applying a spike removal and hole restoration algorithm, and wherein the step of modifying the digital image is dependant on the step of applying the spike removal and hole restoration algorithm.

* * * * *